(12) United States Patent  
Kajikawa et al.

(10) Patent No.: US 9,406,422 B2  
(45) Date of Patent: Aug. 2, 2016

(54) SUPERCONDUCTING MAGNET AND NUCLEAR MAGNETIC RESONANCE DEVICE

(71) Applicant: Kyushu University, National University Corporation, Fukuoka (JP)

(72) Inventors: Kazuhiro Kajikawa, Fukuoka (JP); Kazuo Funaki, Fukuoka (JP)

(73) Assignee: KYUSHU UNIVERSITY National University Corporation, Fukuoka (JP)

( * ) Notice: Subject to any disclaimer, the term of this patent is extended or adjusted under 35 U.S.C. 154(b) by 122 days.

(21) Appl. No.: 14/081,612

(22) Filed: Nov. 15, 2013

(65) Prior Publication Data

US 2014/0296074 A1  Oct. 2, 2014

Related U.S. Application Data

(63) Continuation of application No. PCT/JP2012/062777, filed on May 18, 2012.

(30) Foreign Application Priority Data

May 18, 2011  (JP) .................................. 2011-111708

(51) Int. Cl.
   *H01F 6/06* (2006.01)
   *G01R 33/3815* (2006.01)
   *G01R 33/421* (2006.01)

(52) U.S. Cl.
   CPC .............. *H01F 6/06* (2013.01); *G01R 33/3815* (2013.01); *G01R 33/421* (2013.01)

(58) Field of Classification Search
   CPC .......... H01F 6/00–6/06; G01R 33/38–33/4215
   See application file for complete search history.

(56) References Cited

U.S. PATENT DOCUMENTS 4,422,042 A * 12/1983 Sugimoto ..................... 324/313

FOREIGN PATENT DOCUMENTS

CN  1815839 A   8/2006  
JP  57-004541 A  1/1982

(Continued)

OTHER PUBLICATIONS

Translation of CN1815839A, provided via Global Patent Search Network, pp. 1-5.*

(Continued)

*Primary Examiner* — Colleen Dunn  
(74) *Attorney, Agent, or Firm* — Duquette Law Group, LLC

(57) ABSTRACT

There is provided a superconducting magnet in which magnetization caused by a shielding current of a superconducting winding is eliminated whereby the current to be supplied to the superconducting winding is uniformized, and thus uniformity of the central magnetic field is secured. The superconducting magnet has a superconducting winding composed of a superconductor, and an outer AC winding composed of a superconductor or non-superconductor wound coaxially with the superconducting winding, at an outer side the superconducting winding; and an AC current is supplied to the outer AC winding thereby applying an AC magnetic field in a direction perpendicular to a direction of magnetization caused in the superconducting winding by the shielding current, and thus the magnetization is eliminated. Also, the superconducting magnet has an inner AC winding composed of a superconductor or non-superconductor wound coaxially with the superconducting winding, at an inner side of the superconducting winding layer.

19 Claims, 17 Drawing Sheets

(56) References Cited

FOREIGN PATENT DOCUMENTS

| JP | 08-279411 A | 10/1996 |
|---|---|---|
| JP | 2007-335616 A | 12/2007 |
| WO | 99/24843 A1 | 5/1999 |
| WO | 2010/104940 A1 | 9/2010 |

OTHER PUBLICATIONS

Mikitik, Grigorii and Brandt, Ernst Helmut, "Theory of the Longitudinal Vortex-Shaking Effect in Superconducting Strips," Physical Review, 2003, vol. 67, No. 10, pp. 1-8.
Leblanc, M.A.R. et al., "Generation of Quasi-Reversibility in a Commercial Bi:2223/Ag Tape by Vortex Shaking with Varying Orthogonal Magnetic Fields," Physica C, 2001, vol. 361, pp. 251-259.
Funaki, Kazuo and Yamafuji, Kaoru, "Abnormal Transverse-Field Effects in Nonideal Type II Superconductors I. A Linear Array of Monofilamentary Wires," Japanese Journal of Applied Physics, Feb., 1982, vol. 21, No. 2, pp. 299-304.
Funaki, Kazuo et al., "Abnormal Transverse-Field Effects in Nonideal Type 2 Superconductors. II. Influence of Dimension Ratios in a Superconducting Ribbon," Japanese Journal of Applied Physics, Aug. 1982, vol. 21, No. 8, pp. 1121-1126.
Funaki, Kazuo et al., "Abnormal Transverse-Field Effects in Nonideal Type 2 Superconductors. III. A Theory for an AC-Induced Decrease in the Semi-Quasistatic Magnetization Parallel to a DC Bias Field," Japanese Journal of Applied Physics, Nov. 1982, vol. 21, No. 11, pp. 1580-1587.
Funaki, Kazuo et al., "Abnormal Transverse-Field Effects in Current-Carrying Superconducting Wires," Technology Reports of Kyushu University, 1983, vol. 56, No. 1, pp. 45-51.
Brandt, Ernst Helmut and Mikitik, Grigorii P., "Why an AC Magnetic Field Shifts the Irreversibility Line in Type-II Superconductors", Physical Review Letters, Jul. 8, 2002, vol. 89, No. 2, pp. 027002-1-027002-4.
Brandt, Ernst Helmut and Mikitik, Grigorii P., "Shaking of the Critical State by a Small Transverse AC Field can Cause Rapid Relaxation in Superconductors", Superconductor Science and Technology, 2004, vol. 17, pp. S1-S5.
European Search Report dated Mar. 9, 2015 from corresponding International Application No. PCT/JP2012062777.
Yoshinori Yanagisawa et al: "Effect of YBCO-Coil Shape on the Screening Current-Induced Magnetic Field Intensity", IEEE Transactions on Applied Superconductivity, IEEE Service Center, Los Alamitos, CA., US, vol. 20, No. 3, Jun. 1, 2010, pp. 744-747.
Yanagisawa Y et al: "Effect of Current Sweep Reversal on the Magnetic Field Stability for a Bi-2223 Superconducting Solenoid", Physica C, North-Holland Publishing, Amsterdam, NL, vol. 469, No. 22, Nov. 15, 2009, pp. 1996-1999.
Otsuka A et al: "Evaluation of the Screening Current in a 1.3 GHz NMR Magnet Using ReBCO", IEEE Transactions on Applied Superconductivity, IEEE Service Center, Los Alamitos, CA, US, vol. 21, No. 3, Oct. 28, 2010, pp. 2076-2079.
Yanagisawa Y et al: "Magnitude of the Screening Field for YBCO Coils", IEEE Transactions on Applied Superconductivity, IEEE Service Center, Los Alamitos, CA, US, vol. 21, No. 3, Nov. 22, 2010, pp. 1640-1643.
Kajikawa Kazuhiro et al: "Designs and Tests of Shaking Coils to Reduce Screening Currents Induced in HTS Insert Coils for NMR Magnet", IEEE Transactions on Applied Superconductivity, IEEE Service Center, Los Alamitos, CA, US, vol. 25, No. 3, Jun. 1, 2015, pp. 1-5.
Kazuhiro Kajikawa et al: "Reduction of Magnetization in Windings Composed of HTS Tapes", IEE Transactions on Applied Superconductivity, IEEE Service Center, Los Alamitos, CA, US, vol. 22, No. 3, Dec. 21, 2011, p. 4400404.

* cited by examiner (A)

(B)

$$M_x = \frac{\mu_0}{4ab}\int_{-b}^{b}\mathrm{d}y\int_{-a}^{a}yJ(x,y)\mathrm{d}x$$

$$M_y = -\frac{\mu_0}{4ab}\int_{-b}^{b}\mathrm{d}y\int_{-a}^{a}xJ(x,y)\mathrm{d}x$$

(A)  (B)

SUPERCONDUCTING MAGNET AND NUCLEAR MAGNETIC RESONANCE DEVICE

RELATED APPLICATIONS

This patent application is a continuation of International Application No. PCT/JP2012/062777, filed on May 18, 2012, entitled, "Superconducting Magnet and Nuclear Magnetic Resonance Device," which claims priority to Japanese Patent Application No. 2011-111708, filed on May 18, 2011, the contents and teachings of each of which are hereby incorporated by reference in their entirety.

FIELD

The present innovation relates to a superconducting magnet in which the central magnetic field is uniformized.

BACKGROUND

For example, generally NbTi multifilamentary wires are utilized as windings of superconducting magnets to be used for nuclear magnetic resonance apparatuses and the like (see FIG. 16). The NbTi multifilamentary wire is small in magnetization of a winding since the diameter of one filament is so small as several to several ten micrometers. Liquid helium (with an atmospheric pressure boiling point of around 4 K) is used as a refrigerant for the NbTi multifilamentary wire. The liquid helium is expensive due to lack in resources, and there is a risk of exhaustion sooner or later.

Therefore, research and development for a nuclear magnetic resonance apparatus and the like utilizing a superconductor that is capable of possessing a superconducting property even with the use of a material abundant in resources such as liquid hydrogen (with an atmospheric pressure boiling point of around 20 K) and liquid nitrogen (with an atmospheric pressure boiling point of around 77 K) is in progress. A superconducting wire using these types of superconductors typically has a shape of a tape as shown in FIG. 17, and a superconducting layer thereof is around several millimeters in width, and around several to several hundred micrometers in thickness. Thus, when such a superconducting wire is used for a winding, magnetization of the winding becomes very large, and an electric current flowing in the winding becomes non-uniform due to a shielding current, whereby uniformity of the central magnetic field becomes diminished.

On the other hand, non-patent literatures 1 to 4 disclose dissertations regarding abnormal transverse-field effects, that is, when an AC magnetic field perpendicular to a DC transverse magnetic field is applied thereto, magnetization M in the direction of the DC magnetic field asymptotically varies with the periodic variation of the AC magnetic field; and when an amplitude of the AC magnetic field becomes larger than a certain value, the magnetization M is eliminated in a steady state. Further, non-patent literatures 5 and 6 disclose that the abnormal transverse-field effects are observed also in a tape-shaped superconducting wire.

NPTL 1: Kazuo Funaki and Kaoru Yamafuji, "Abnormal Transverse-Field Effects in Nonideal Type II Superconductors I. A Linear Array of Monofilamentary Wires", Japanese Journal of Applied Physics, Vol. 21, No. 2, February 1982, pp. 299-304

NPTL 2: Kazuo Funaki, Teruhide Niidome and Kaoru Yamafuji, "Abnormal Transverse-Field Effects in Nonideal Type 2 Superconductors. II. Influence of Dimention Ratios in a Superconducting Ribbon", Japanese Journal of Applied Physics, Vol. 21, No. 8, August 1982, pp. 1121-1126

NPTL 3: Kazuo Funaki, Minoru Noda and Kaoru Yamafuji, "Abnormal Transverse-Field Effects in Nonideal Type 2 Superconductors. III. A Theory for an AC-Induced Decrease in the Semi-Quasistatic Magnetization Parallel to a DC Bias Field", Japanese Journal of Applied Physics, Vol. 21, No. 11, November 1982, pp. 1580-1587

NPTL 4: Kazuo Funaki, Teruhide Niidome and Kaoru Yamafuji, "Abnormal Transverse-Field Effects in Current Carrying Superconducting Wires", Technology Reports of Kyushu University, Vol. 56, No. 1, January 1983, pp. 45-51

NPTL 5: Ernst Helmut Brandt and Grigorii P. Mikitik, "Why an ac Magnetic Field Shifts the Irreversibility Line in Type-II Superconductors", Physical Review Letters, Vol. 89, No. 2, July 2002, 027002

NPTL 6: Ernst Helmut Brandt and Grigorii P. Mikitik, "Shaking of the critical state by a small transverse ac field can cause rapid relaxation in superconductors", Superconductor Science and Technology, Vol. 17, No. 2, February 2004, pp. S1-S5

SUMMARY

However, the techniques disclosed in the above-described non-patent literatures 1 to 6 are to demonstrate that the abnormal transverse-field effects are exerted on a single wire or a one-dimensional array of a plurality of short-length sample wires, and those are not techniques to ensure uniformity of the central magnetic field in a superconducting magnet wound with a superconducting wire.

The present innovation provides a superconducting magnet and the like in which magnetization caused by a shielding current of a superconducting winding is eliminated whereby the current to be supplied to the superconducting winding is uniformized, and thus uniformity of the central magnetic field is secured.

A superconducting magnet disclosed in the present application includes a superconducting winding composed of a superconductor, and a magnetic field application unit configured to apply an AC magnetic field in a direction perpendicular to a direction of magnetization caused by a shielding current in the superconducting winding.

As is described above, in the superconducting magnet disclosed in the present application, an effect is exerted as follows: since it applies an AC magnetic field in a direction perpendicular to a direction of magnetization caused by a shielding current in the superconducting winding composed of a superconductor; the magnetization caused by the shielding current can be eliminated, and thus the central magnetic field can be uniformized.

In the superconducting magnet disclosed in the present application, the magnetic field application unit applies the AC magnetic field, and has an AC winding to which an AC current is supplied so that current flow directions at an outer side of the superconducting winding and at an inner side thereof are opposite to each other.

As is described above, in the superconducting magnet disclosed in the present application, an effect is exerted as follows: since it has an AC winding to which an AC current is supplied so that current flow directions at an outer side of the superconducting winding and at an inner side thereof are opposite to each other; the magnetic field of the outer AC winding produced inside the inner AC winding can be negated by the magnetic field of the inner AC winding, thereby allowing to diminish the inductance, and thus it can be operated by a small power source.

In the superconducting magnet disclosed in the present application, the magnetic field application unit has an outer AC winding composed of a superconductor or non-superconductor wound coaxially with the superconducting winding, at an outer side of the superconducting winding, and an AC current is supplied to the outer AC winding.

As is described above, in the superconducting magnet disclosed in the present application, an effect is exerted as follows: since it has an outer AC winding composed of a superconductor or non-superconductor wound coaxially with the superconducting winding, at an outer side of the superconducting winding, and an AC current is supplied to the outer AC winding; it can apply an AC magnetic field in a direction perpendicular to a direction of magnetization caused by a shielding current in the superconducting winding, whereby the magnetization caused by the shielding current is eliminated, and thus the central magnetic field can be uniformized.

In the superconducting magnet disclosed in the present application, the magnetic field application unit has an inner AC winding composed of a superconductor or non-superconductor wound coaxially with the superconducting winding, at an inner side of the superconducting winding, and a current direction to be supplied to the outer AC winding, and a direction of a current to be supplied to the inner AC winding are to be in opposite directions to each other.

As is described above, in the superconducting magnet disclosed in the present application, an effect is exerted as follows: since it has an inner AC winding composed of a superconductor or non-superconductor wound coaxially with the superconducting winding, at an inner side of the superconducting winding, and a direction of a current to be supplied to the outer AC winding and a direction of a current to be supplied to the inner AC winding are to be in opposite directions to each other; the magnetic field of the outer AC winding produced inside the inner AC winding can be negated by the magnetic field of the inner AC winding, thereby allowing to diminish the inductance, and thus it can be operated by a small power source.

In the superconducting magnet disclosed in the present application, the magnetic field application unit has an AC winding composed of a superconductor or non-superconductor wound encircling the superconducting winding in a direction perpendicular to a winding direction of the superconducting winding, and an AC current is supplied to the AC winding.

As is described above, in the superconducting magnet disclosed in the present application, an effect is exerted as follows: since it has an AC winding composed of a superconductor or non-superconductor wound encircling the superconducting winding in a direction perpendicular to a winding direction of the superconducting winding, and an AC current is supplied to the AC winding; it can apply an AC magnetic field in a direction perpendicular to a direction of magnetization caused by a shielding current in the superconducting winding, whereby the magnetization caused by the shielding current is eliminated, and thus the central magnetic field can be uniformized. Also, since it can be configured so that the current flow directions at an outer side of the superconducting winding and at an inner side thereof are opposite to each other, the magnetic field of the outer AC winding produced inside the inner AC winding can be negated by the magnetic field of the inner AC winding, thereby allowing to diminish the inductance, and thus it can be operated by a small power source.

The superconducting magnet disclosed in the present application, the superconducting winding is a tape-shaped winding composed of a high temperature superconductor.

As is described above, in the superconducting magnet disclosed in the present application, an effect is exerted as follows: since it is a tape-shaped winding composed of a high temperature superconductor; liquid helium which is expensive and lack in resources is not required to be used, so instead thereof, a material which is inexpensive and abundant in resources can be effectively utilized.

In the superconducting magnet disclosed in the present application, the magnetic field application unit gradually attenuates an AC magnetic field to be applied As is described above, in the superconducting magnet disclosed in the present application, an effect is exerted as follows: since the magnetic field application unit gradually attenuates an AC magnetic field to be applied; magnetization in a direction of the AC magnetic field by the abnormal transverse-field effects can be diminished, and thus influence of the superconducting magnet on the central magnetic field can be minimized.

The superconducting magnet disclosed in the present application, further includes a temperature control unit configured to raise a temperature of the superconducting winding for a predetermined time period.

As is described above, in the superconducting magnet disclosed in the present application, an effect is exerted as follows since it includes a temperature control unit configured to raise a temperature of the superconducting winding for a predetermined time period; the temperature of the superconducting winding is raised for a predetermined time period whereby the critical current density slightly decreases, and the temperature of the superconducting winding is cooled again immediately after the critical current density decreased whereby the critical current density increases, and thus influence of the quantized magnetic flux lines on the thermal fluctuation can be suppressed. As a result, the magnetic flux creep, a phenomenon that the quantized magnetic flux lines are moved by the thermal fluctuation, can be significantly suppressed, and thus uniformity of the central magnetic field can be maintained for a long time.

In the superconducting magnet disclosed in the present application, the temperature control unit is the AC winding, and the AC winding and the superconducting winding are arranged to be in a closely contact state.

As is described above, in the superconducting magnet disclosed in the present application, an effect is exerted as follows: since the AC winding and the superconducting winding are arranged to be in a closely contact state; a heat generated in the AC winding is transferred to the superconducting winding and then the temperature of the superconducting winding is raised for a predetermined time period whereby the critical current density slightly decreases, and the temperature of the superconducting winding is cooled again immediately after the critical current density decreased whereby the critical current density increases, and thus influence of the quantized magnetic flux lines on the thermal fluctuation can be suppressed. As a result, the magnetic flux creep, a phenomenon that the quantized magnetic flux lines are moved by the thermal fluctuation, can be significantly suppressed, and uniformity of the central magnetic field can be maintained for a long time.

In the superconducting magnet disclosed in the present application, the temperature control unit has a pressure control section configured to control a pressure in a housing where the superconducting magnet is accommodated with a refrigerant.

As is described above, in the superconducting magnet disclosed in the present application, an effect is exerted as follows: since the temperature control unit controls a pressure in a housing where the superconducting magnet is accommodated with a refrigerant; the temperature of the refrigerant in the housing is raised and then the temperature of the superconducting winding is raised for a predetermined time period whereby the critical current density slightly decreases, and the temperature of the superconducting winding is cooled again immediately after the critical current density decreased whereby the critical current density increases, and thus influence of the quantized magnetic flux lines on the thermal fluctuation can be suppressed. As a result, the magnetic flux creep, a phenomenon that the quantized magnetic flux lines are moved by the thermal fluctuation, can be significantly suppressed, and uniformity of the central magnetic field can be maintained for a long time.

A nuclear magnetic resonance apparatus disclosed in the present application is that the superconducting magnet is used therefor, in which the magnetic field application unit applies an AC magnetic field for a predetermined time period in advance of measuring an object to be measured, and does not apply the AC magnetic field at the time of measurement.

As is described above, in the nuclear magnetic resonance apparatus disclosed in the present application, an effect is exerted as follows: since it applies an AC magnetic field for a predetermined time period in advance of measuring an object to be measured, and does not apply the AC magnetic field at the time of measurement; there is no influence of the AC magnetic field during the measurement, and therefore precise measurement can be achieved.

In the nuclear magnetic resonance apparatus disclosed in the present application, the magnetic field application unit applies the AC magnetic field when a value of a current to be supplied to the superconducting winding is changed.

As is described above, in the nuclear magnetic resonance apparatus disclosed in the present application, an effect is exerted as follows: since it applies the AC magnetic field when a value of a current to be supplied to the superconducting winding is changed; even when the measurement environment is changed and the current value is changed, the central magnetic field in the superconducting magnet can be uniformized by eliminating magnetization caused by the shielding current, and thus precise measurement can be achieved. That is, even though the superconducting magnet is reset and the shielding current flows again when the current value is changed, magnetization caused by the shielding current can be eliminated by applying the AC magnetic field.

DETAILED DESCRIPTION

Hereinafter, embodiments of the present innovation will be described. Throughout the present embodiments, identical components are denoted with the same numerals respectively.

First Embodiment of the Innovation

Figure 1:
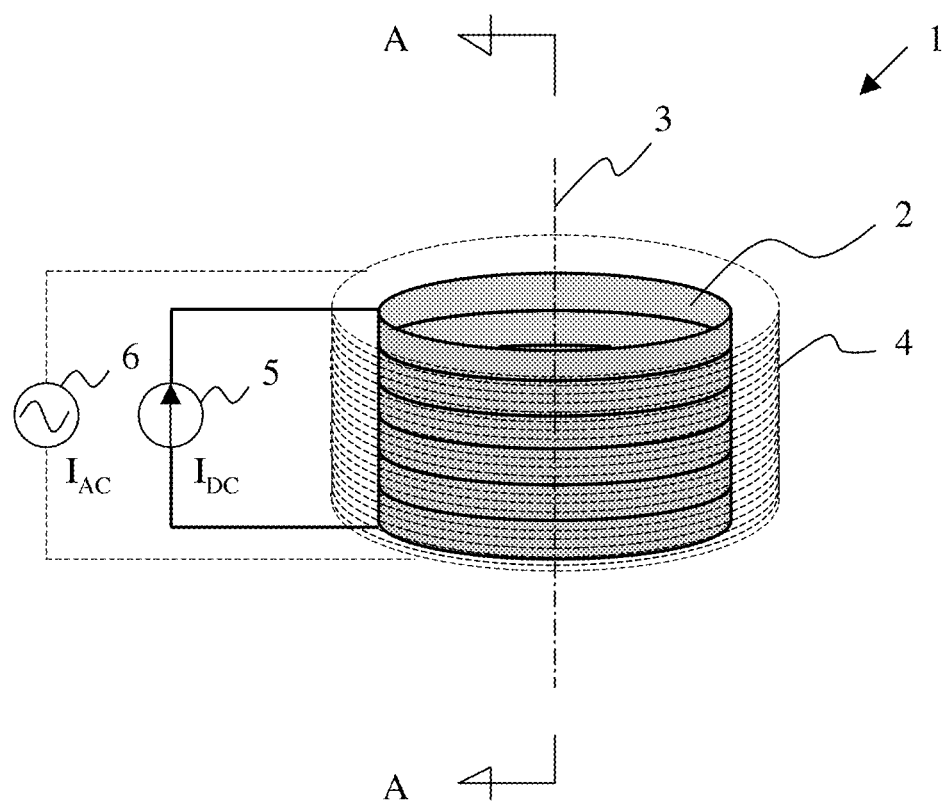
FIG. 1 is a first perspective diagram of windings in a superconducting magnet according to the first embodiment.
Figure 2:
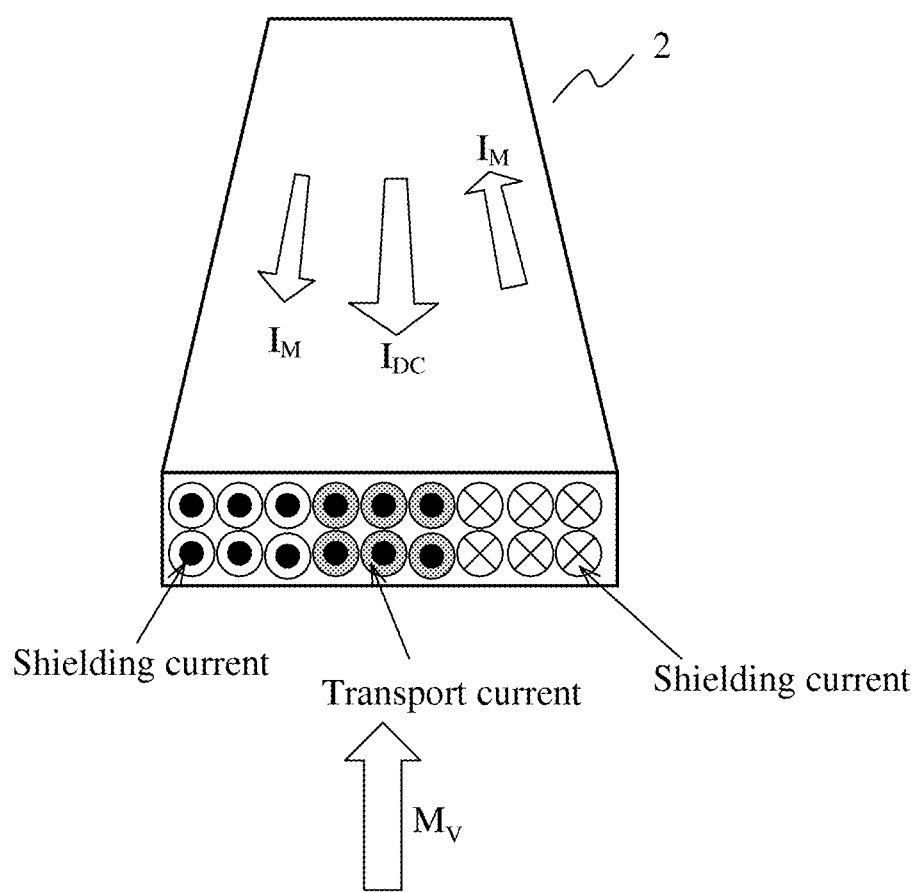
FIG. 2 is a first diagram showing shielding currents and a magnetization direction of a tape wire in the superconducting magnet according to the first embodiment.
Figure 3:
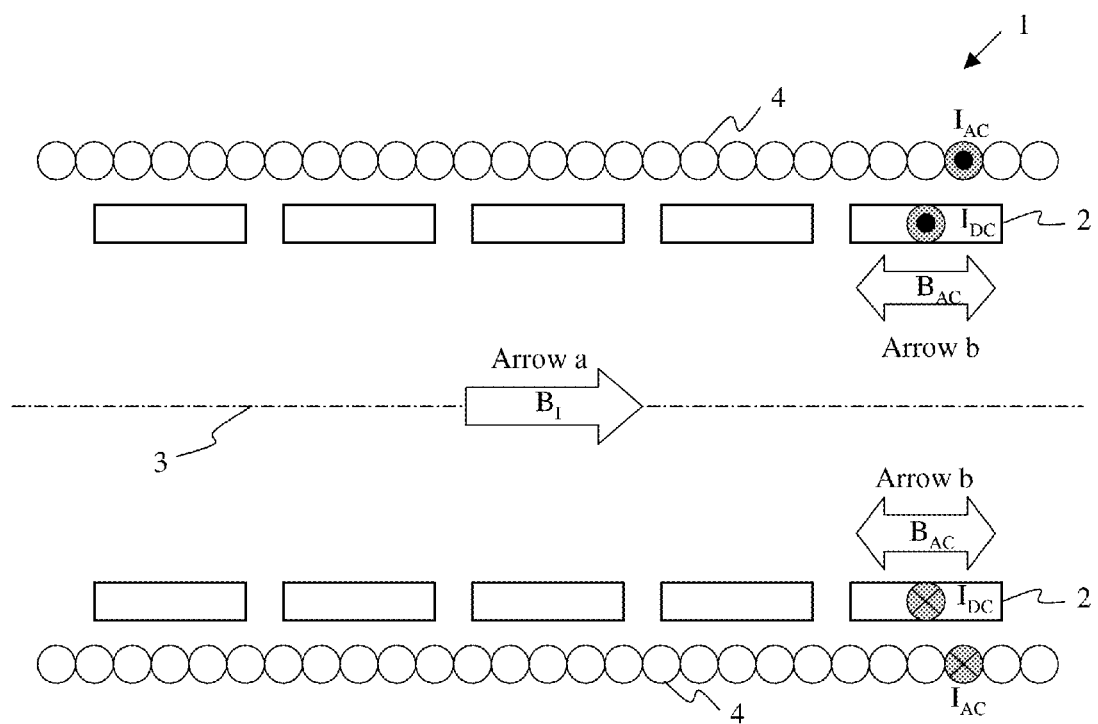
FIG. 3 is a first cross-sectional diagram of the windings in the superconducting magnet according to the first embodiment.
Figure 4:
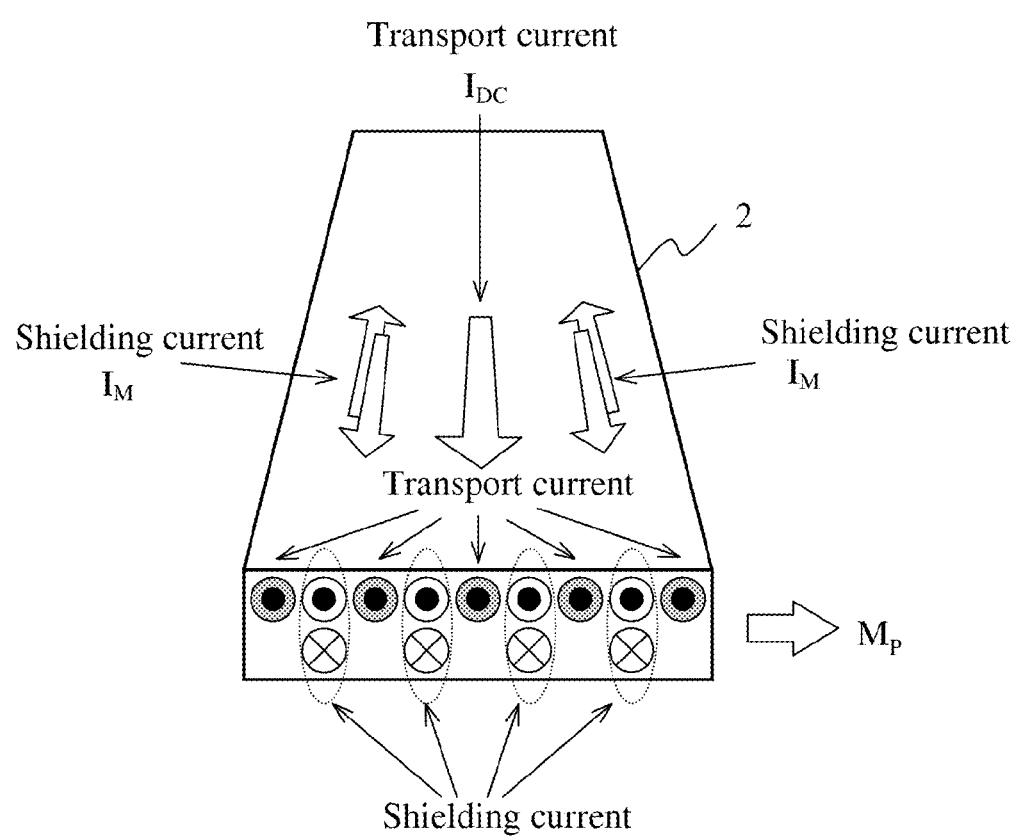
FIG. 4 is a second diagram showing shielding currents and a magnetization direction of a tape wire in a superconducting magnet according to the first embodiment.
Figure 5:
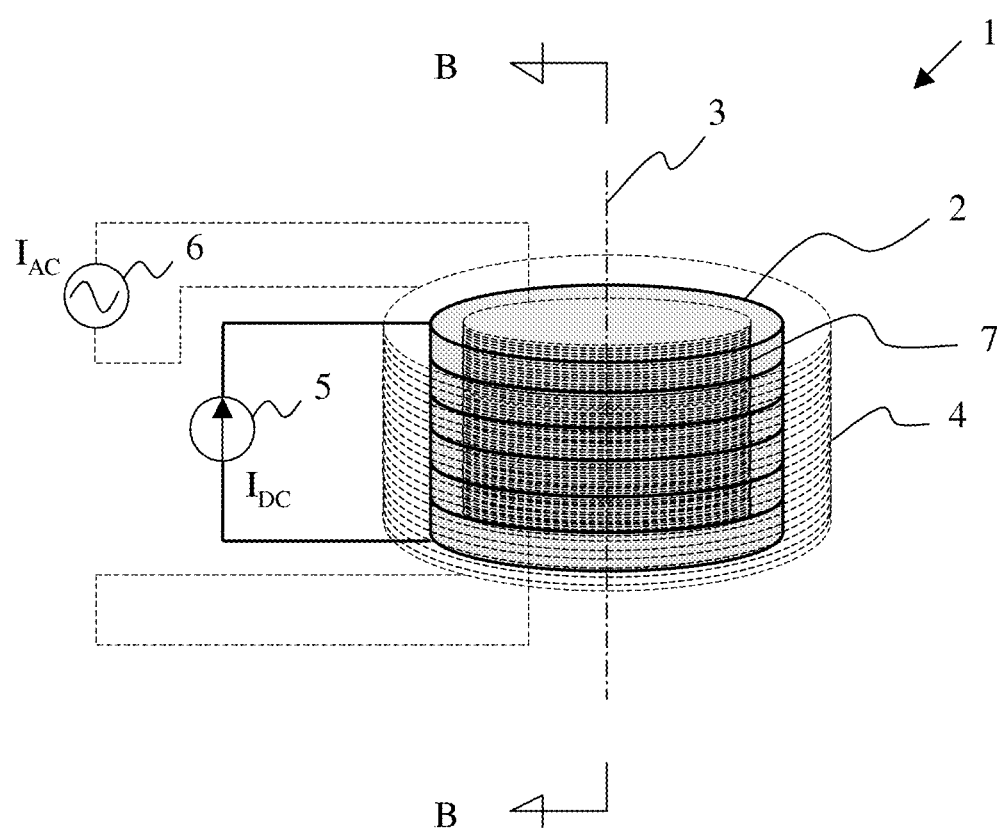
FIG. 5 is a second perspective diagram of windings in the superconducting magnet according to the first embodiment.
Figure 6:
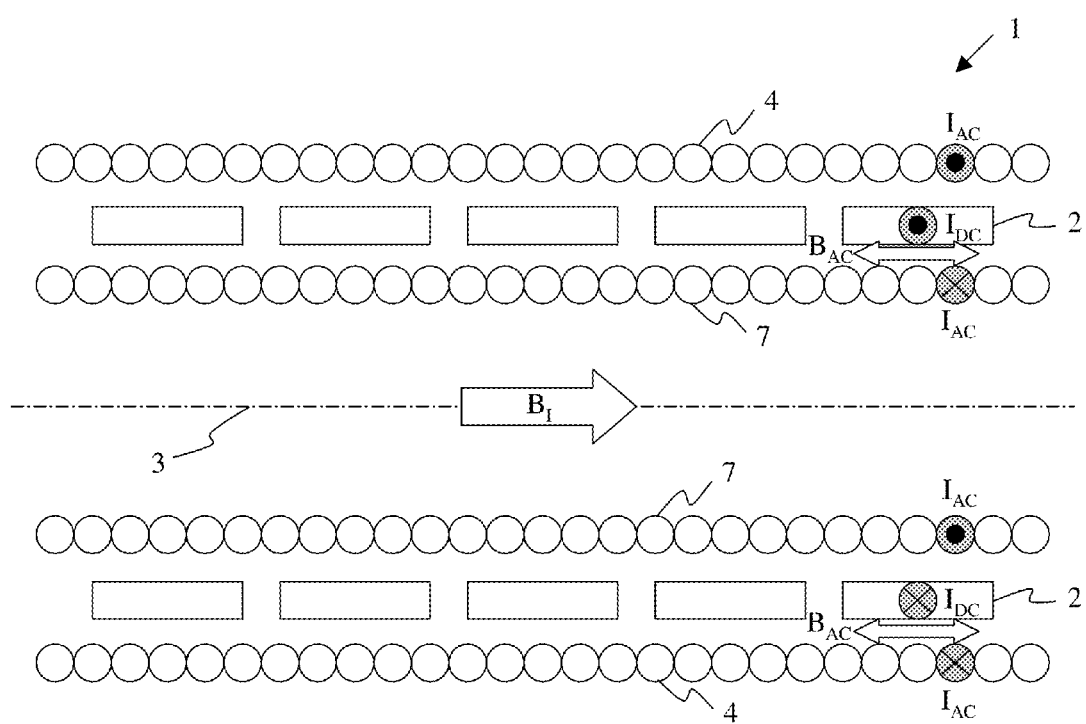
FIG. 6 is a second cross-sectional diagram of the windings in the superconducting magnet according to the first embodiment.
Figure 7:
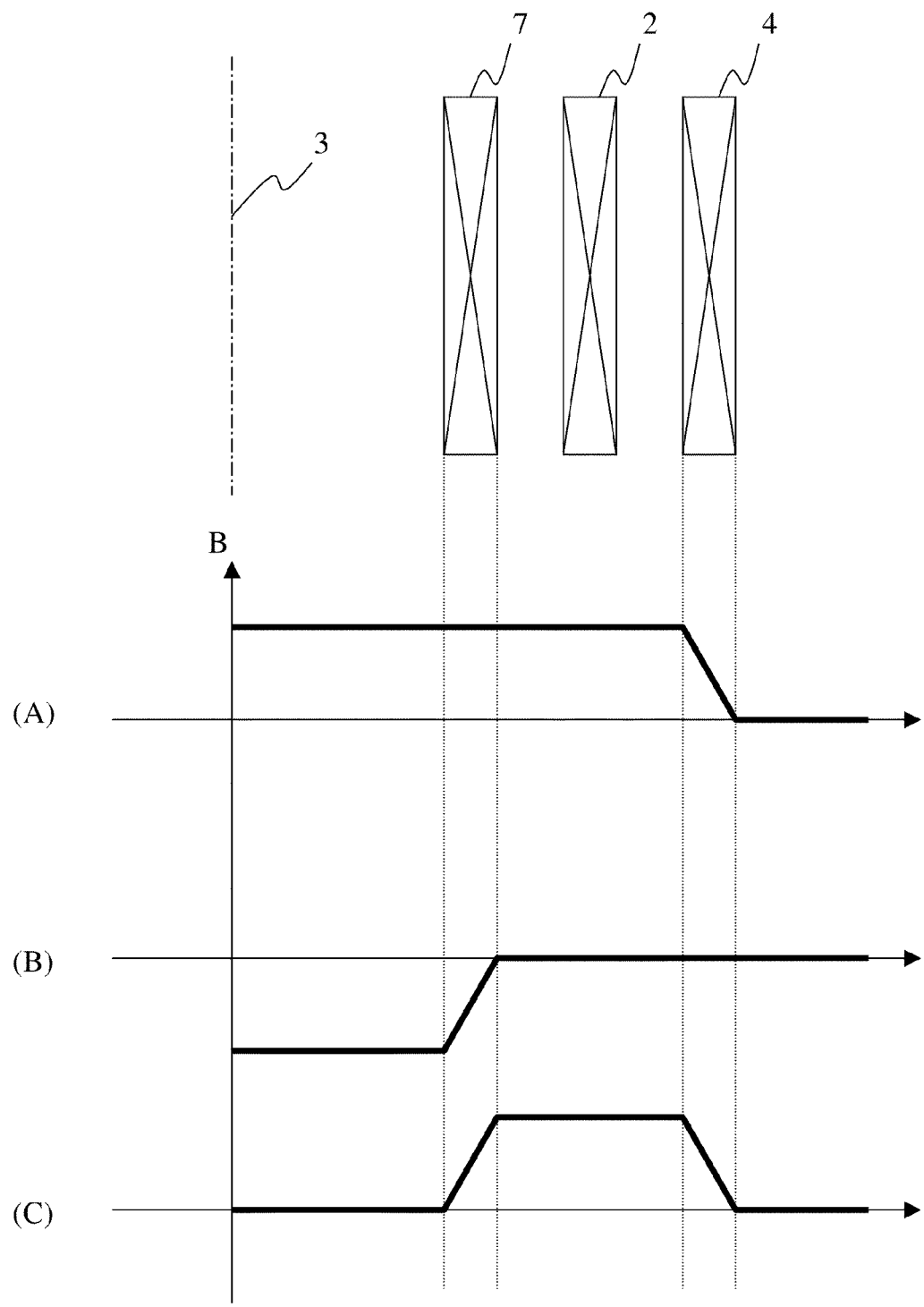
FIG. 7 is a diagram showing magnetic field distribution of an outer AC winding and an inner AC winding in the superconducting magnet according to the first embodiment.

A superconducting magnet according to the present embodiment will be described with the use of FIG. 1 to FIG. 7. FIG. 1 is a first perspective diagram of windings in a superconducting magnet according to the present embodiment; FIG. 2 is a first diagram showing shielding currents and a magnetization direction of a tape wire in the superconducting magnet according to the present embodiment; FIG. 3 is a first cross-sectional diagram of the windings in the superconducting magnet according to the present embodiment; FIG. 4 is a second diagram showing shielding currents and a magnetization direction of a tape wire in a superconducting magnet according to the present embodiment; FIG. 5 is a second perspective diagram of windings in the superconducting magnet according to the present embodiment; FIG. 6 is a second cross-sectional diagram of the windings in the superconducting magnet according to the present embodiment; and FIG. 7 is a diagram showing magnetic field distribution of an outer AC winding and an inner AC winding in the superconducting magnet according to the present embodiment.

A superconducting magnet 1 according to the present embodiment includes: a superconducting winding 2 composed of a superconductor; an outer AC winding 4 composed of a superconductor or a non-superconductor wound coaxially with the central axis 3 of the superconducting winding 2, at an outer side of the superconducting winding 2; a DC power source unit 5 configured to supply a DC current to the superconducting winding 2; and an AC power source unit 6 configured to supply an AC current to the outer AC winding 4.

The superconducting winding 2 may be any winding as long as it is composed of a superconductor, and particularly a winding composed of a high temperature superconducting wire such as a Bi2223 Ag-sheathed tape wire, Y-based or a rare earth-based thin film conductor is used herein. When forming a superconducting magnet using these wires, typically a superconducting layer has a tape-like shape with several millimeters in width (e.g., Bi-2223 wire: approx. 4 mm; Y-123 wire: approx. 10 mm), and with several to several hundred micrometers in thickness (e.g., Bi-2223 wire: approx. 200 μm; Y-123 wire: approx. 1 μm); and when such a wire is wound and supplied with a current $I_{DC}$ (that denotes a transport current), uniformity of the central magnetic field is diminished due to magnetization caused by a shielding current in the winding itself.

FIG. 2 shows the magnetization caused by the shielding current at the time. As shown in FIG. 2, a transport current $I_{DC}$ flows from one end toward the other end of a tape wire, and shielding currents $I_M$ flow in the tape wider-width surface of the superconducting winding 2. The magnetization (that is denoted with $M_V$) is caused in a direction perpendicular to the tape surface by the shielding current $I_M$, whereby uniformity of the central magnetic field in the superconducting magnet 1 is diminished. However, in this case, the transport current $I_{DC}$ which flows from one end toward the other end of the tape wire and the shielding current $I_M$ which is a closed loop current cannot be discriminated from each other.

Figure 17:
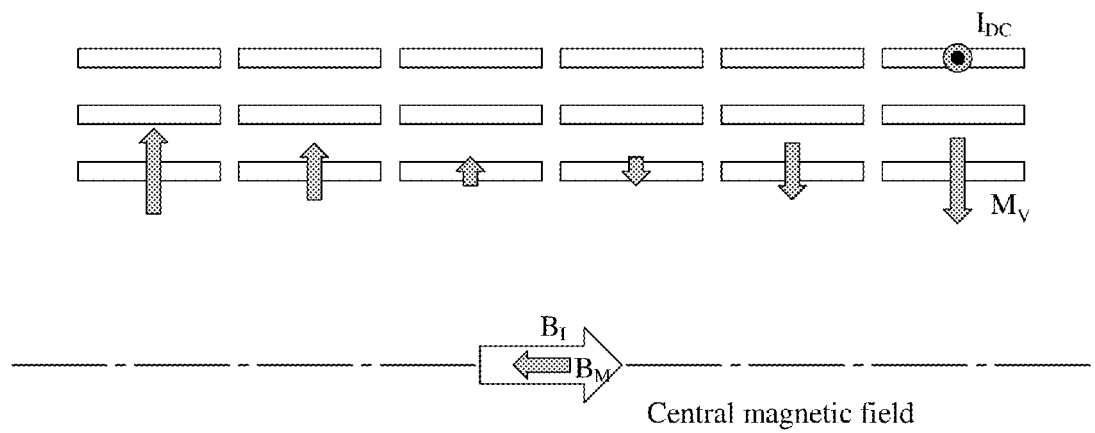
FIG. 17 is a diagram showing a superconducting magnet where a conventional tape wire is used therefore.

According to the present embodiment, in order to eliminate the magnetization in a direction perpendicular to the tape surface as shown in FIG. 17 and FIG. 2, an AC magnetic field is applied, as shown in FIG. 3, in a direction perpendicular to the direction of the magnetization caused by the shielding current in the superconducting winding 2. FIG. 3 is an arrow view taken along the arrow A in FIG. 1. As shown in FIG. 3, a tape-shaped superconducting winding 2 is wound a plurality of turns, and an outer AC winding 4 is wound at the outer side thereof. A central magnetic field $B_I$ indicated with the arrow a is produced by the transport current $I_{DC}$ in the superconducting winding 2. It is noted that although the superconducting winding 2 is shown as only a single layer in FIG. 3, the superconducting winding 2 may be wound around so as to form a plurality of layers.

An AC magnetic field $B_{AC}$ indicated with the arrow b in FIG. 3 is applied by the outer AC winding 4 in a direction perpendicular to the magnetization $M_V$ shown in FIG. 17 and FIG. 2. That is, the AC magnetic field $B_{AC}$ is applied by supplying an AC current $I_{AC}$ to the outer AC winding 4. By applying the AC magnetic field $B_{AC}$ to the superconducting winding 2, the magnetization $M_V$ in a direction perpendicular to the tape surface is eliminated by the abnormal transverse-field effects, and is changed into a magnetization $M_P$ in a direction parallel to the tape surface.

FIG. 4 shows magnetization caused by the shielding current after the change. As shown in FIG. 4, the shielding currents $I_M$ become to flow as a pair at the upper surface and the lower surface of the tape wire by the abnormal transverse-field effects, and the magnetization $M_V$ is eliminated and changed into the magnetization $M_P$, which is parallel to the tape surface. The magnetization $M_P$, which is parallel to the tape surface, has no influence on uniformity of the central magnetic field in the superconducting magnet 1. In other words, the central magnetic field $B_I$ in the superconducting magnet 1 produced by the transport current $I_{DC}$ can be maintained uniformly.

In this regard, the outer AC winding 4 may be a winding composed of a superconductor or may be a winding composed of a non-superconductor. That is, either type of winding is available as long as a certain magnitude of AC magnetic field (lower limit value), which is determined according to the thickness, the critical current density, and the transport current $I_{DC}$ of the superconducting winding 2, can be applied.

Hereinafter, the magnitude of the AC magnetic field will be described more specifically. The following equation is established on the threshold (lower limit value) [T] of the abnormal transverse-field effects.

$$B_{th} = \frac{\mu_0 J_C d}{2}\left(1 - \frac{I_{DC}}{I_C}\right) \quad \text{Formula 1}$$

Where $\mu_0$ is a space permeability, $J_C$ is a critical current density, $I_C$ is a critical current, $I_{DC}$ is a transport current, and d is a tape thickness of the superconducting winding 2. That is, a threshold $B_{th}$ of the AC magnetic field to be applied is determined according to the critical current density $J_C$, the tape thickness d, and the transport current $I_{DC}$ (or a load factor $I_{DC}/I_C$ expressed by the transport current to the critical current). Therefore, the innovation of the present application can be achieved by designing the outer AC winding 4 so that such a $B_{th}$ can be applied. And, as described above, since a tape of a high temperature superconducting wire is very thin as around several millimeters in width, and around several to several hundred micrometers in thickness, the value of the AC magnetic field to be applied can be micrified.

Further, the AC current is not required to be constantly supplied to the outer AC winding 4, that is, the magnetization $M_V$ in a direction perpendicular to the tape surface can be changed into the magnetization $M_P$ in a direction parallel to the tape surface by supplying a defined current as the transport current $I_{DC}$ only for a predetermined time period (e.g., several to several ten seconds or several to several thousand cycles), whereby the state can be maintained and the central magnetic field $B_I$ in the superconducting magnet 1 can be maintained uniformly. When the superconducting magnet according to the present embodiment is used for measurement etc., the magnetization $M_V$ may be eliminated in advance of the measurement.

Furthermore, when supplying the AC current, a value of the current may be gradually decreased. In other words, since the magnetization $M_P$ after application of the AC magnetic field is maintained in the state when application of the AC magnetic field was stopped, influence of the magnetization $M_P$ can be minimized by gradually attenuating the AC current.

Thus as described above, the central magnetic field in the superconducting magnet 1 can be uniformized by applying the AC magnetic field to the superconducting winding 2. However, in this case, since inductance of the outer AC winding 4 becomes large, there a large power source may be required. Then, in the present embodiment, it may be arranged to further provide an inner AC winding 7 at the inner side of the superconducting winding 2 in order to negate the magnetic field of the outer AC winding 4.

FIG. 5 is a perspective diagram of the superconducting magnet 1 in the case where the inner AC winding 7 is provided therein; and FIG. 6 is an arrow view taken along the arrow B in FIG. 5. As shown in FIG. 5 and FIG. 6, the superconducting magnet 1 is provided with the inner AC winding 7 at an inner side of the superconducting winding 2 wherein the inner AC winding 7 is connected to an AC power source unit 6; and directions of a current flowing in the outer AC winding 4 and a current flowing in the inner AC winding 7 are controlled to be opposite to each other. In short, as shown in FIG. 7, among the magnetic fields (see FIG. 7 (A)) produced at the inner side of the outer AC winding 4, the magnetic field (see FIG. 7 (B)) produced at the inner side of the inner AC winding 7 can be counterbalanced (see FIG. 7 (C)), therefore the inductance can be diminished. Thus, the current can be supplied by a small power source.

In this regard, similarly to the outer AC winding 4, the inner AC winding 7 may be a winding composed of a superconductor or may be a winding composed of a non-superconductor. Moreover, by forming the respective AC windings into a tape-like shape similarly to the superconducting winding 2, the process and time for winding them can be reduced and therefore efficiency of the manufacturing process can be greatly enhanced.

Thus as described above, the magnetic field of the outer AC winding 4 produced inside the inner AC winding 7 can be negated by the magnetic field of the inner AC winding 7, thereby allowing to diminish the inductance, and thus it can be operated by a small power source.

Second Embodiment of the Innovation

Figure 8:
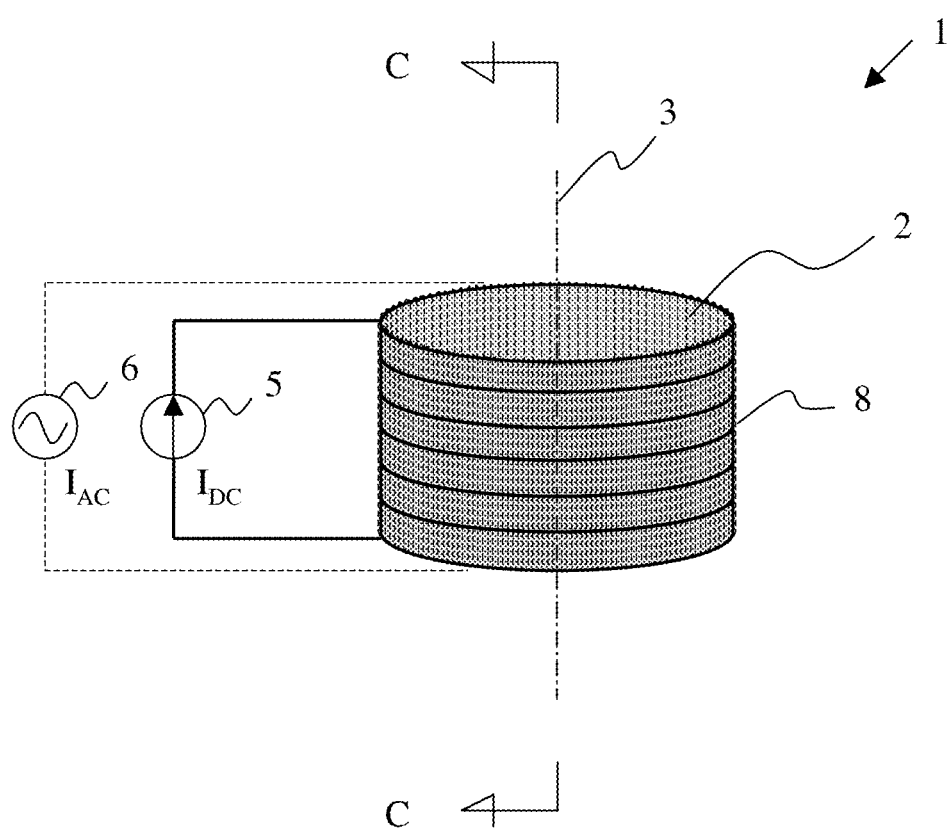
FIG. 8 is a perspective diagram of windings in a superconducting magnet according to a second embodiment.

A superconducting magnet according to the present embodiment will be described with the use of FIG. 8 and FIG. 9. FIG. 8 is a perspective diagram of windings in a superconducting magnet according to the present embodiment; and FIG. 9 is a cross-sectional diagram of the windings in the superconducting magnet according to the present embodiment.

It is noted that, in the present embodiment, overlapped descriptions with those of the first embodiment will be omitted.

A superconducting magnet 1 according to the present embodiment includes: a superconducting winding 2 composed of a superconductor; an AC winding 8 composed of a superconductor or a non-superconductor that is wound encircling the superconducting winding 2 in a direction perpendicular to the winding direction of the superconducting winding 2; a DC power source unit 5 configured to supply a DC current to the superconducting winding 2; and an AC power source unit 6 configured to supply an AC current to the AC winding 8.

Figure 9:
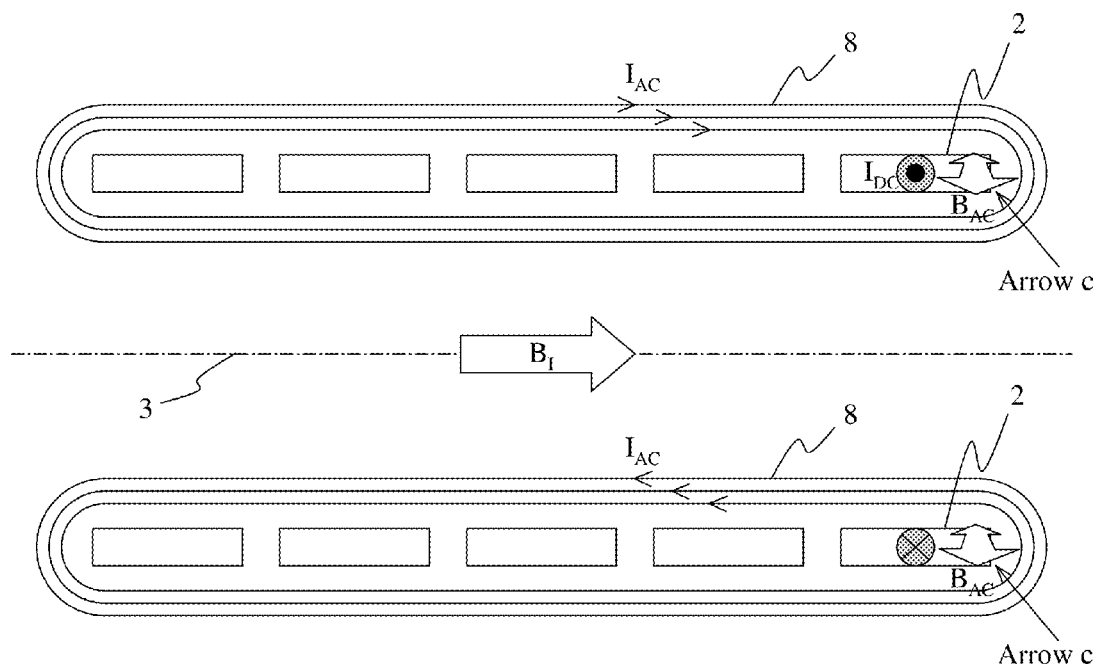
FIG. 9 is a cross-sectional diagram of the windings in the superconducting magnet according to the second embodiment.

FIG. 9 is an arrow view taken along the arrow C in FIG. 8. According to the present embodiment, in order to eliminate the magnetization $M_V$ in a direction perpendicular to the tape surface as shown in FIG. 17 and FIG. 2, the AC winding 8 is wound in a direction perpendicular to a winding direction of the superconducting winding 2 (in the same direction with the axis of the superconducting winding 2) so as to enclose the superconducting winding 2, and then to connect to the AC power source unit 6, as shown in FIG. 8 and FIG. 9. The AC magnetic field $B_{AC}$ indicated with the arrow c (the arrow being in a direction perpendicular to the plane of paper) in FIG. 9 is applied by supplying the AC current $I_{AC}$ to the AC winding 8; and the magnetization $M_V$ in a direction perpendicular to the tape surface is eliminated by the abnormal transverse-field effects, and thus is changed into the magnetization $M_P$ in a direction parallel to the tape surface. The magnetization $M_P$ is that indicated with the arrow of the magnetization $M_P$ shown in FIG. 4 is rotated by 90 degrees while maintaining it in parallel to the tape surface, and the magnetization $M_P$ has no influence on uniformity of the central magnetic field. Thus, similarly to the case of the first embodiment, the central magnetic field $B_I$ produced by the transport current can be maintained uniformly.

In this regard, here also the AC winding 8 may be a winding composed of a superconductor or may be a winding composed of a non-superconductor. That is, either type of winding is available as long as a certain magnitude of AC magnetic field (lower limit value), which is determined according to the thickness, the critical current density, and the transport current $I_{DC}$ of the superconducting winding 2, can be applied.

Further, the AC current is not required to be constantly supplied to the outer AC winding 8, that is, the magnetization $M_V$ in a direction perpendicular to the tape surface can be changed into the magnetization $M_P$ in a direction parallel to the tape surface by supplying a defined current as the transport current $I_{DC}$ only for a predetermined time period (e.g., several to several ten seconds or several to several thousand cycles), whereby the state can be maintained and the central magnetic field $B_I$ can be maintained uniformly.

Thus as described above, the central magnetic field in the superconducting magnet can be uniformized by applying the AC magnetic field to the superconducting winding 2.

Other Embodiments

Since the superconducting magnet 1 according to each of the above-described embodiments is capable of maintaining high uniformity of the central magnetic field, it is suitable for use in NMR (Nuclear Magnetic Resonance) and MRI (Magnetic Resonance Imaging) which require highly accurate uniformity of the central magnetic field.

When the superconducting magnet according to the present innovation is used in NMR or MRI, the magnetization $M_V$ is changed into $M_P$ by performing the process of applying the AC magnetic field to the superconducting winding 2 for a predetermined time period in advance of measurement. And then, measurement of an object is performed while application of the AC magnetic field is in a stopped state. Unless the current value is changed, other objects can be measured in sequence as it is. When the measurement environment is changed, and the current value is changed or the apparatus is reset therein, the magnetization $M_V$ is changed into $M_P$ by applying the AC magnetic field for a predetermined time period, again.

Further, in the superconducting magnet 1 according to the present innovation, by applying the AC magnetic field, a current distribution of the superconducting winding 2 changes, and the quantized magnetic flux lines move thereby generating heat. Then by the generated heat, the temperature of the superconducting winding 2 slightly rises for a very short time period, and the critical current density slightly decreases. And then, the superconducting winding is cooled again immediately after the critical current density decreased, whereby the critical current density increases, and thus the influence of the quantized magnetic flux lines on the thermal fluctuation can be suppressed. As a result, the magnetic flux creep, a phenomenon that the quantized magnetic flux lines are moved by the thermal fluctuation, can be significantly suppressed, and there is an additional advantage that uniformity of the central magnetic field can be maintained for a long time.

Furthermore, a heat generated in the AC winding is transferred to the superconducting winding 2, whereby the magnetic flux creep, which is a phenomenon that the quantized magnetic flux lines are moved by the thermal fluctuation, can be significantly suppressed due to a similar function to that described above, and uniformity of the central magnetic field can be maintained for a long time.

Still further, the temperature of the refrigerant is raised (e.g., around 1° C. to 2° C.) by externally applying a pressure to the superconducting magnet 1, whereby the magnetic flux creep, which is a phenomenon that the quantized magnetic flux lines are moved by the thermal fluctuation, can be significantly suppressed due to the rise in temperature of the refrigerant functioning similarly to that described above, and uniformity of the central magnetic field can be maintained for a long time.

Figure 10:
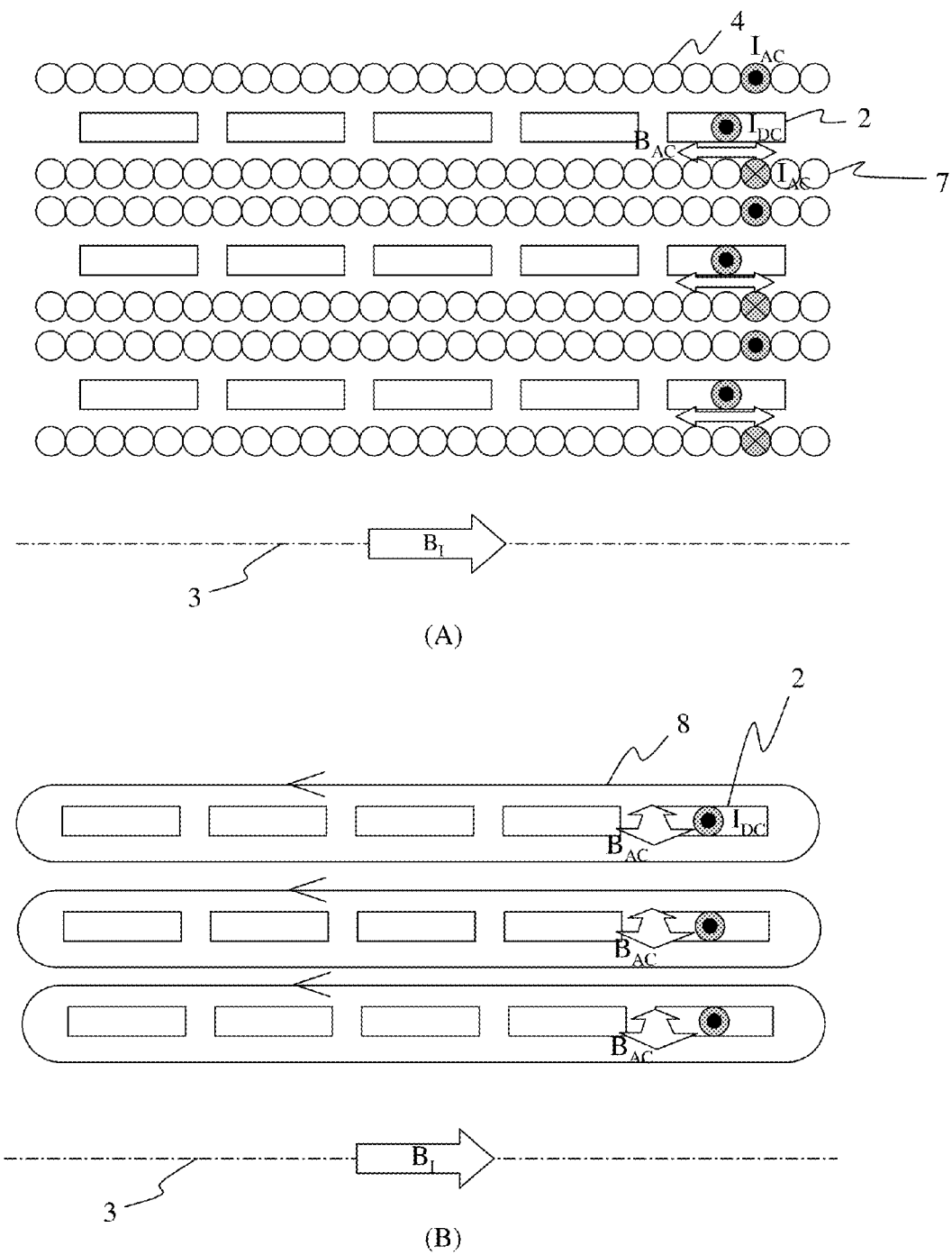
FIG. 10 shows cross-sectional diagrams of windings in superconducting magnets according to another embodiment.

The superconducting magnet according to the present innovation may be configured like FIGS. 10 (A) and (B). In short, the AC magnetic field may be individually applied to each of a plurality of sites constituting the superconducting winding 2. As an example, in FIG. 10 (A), the AC magnetic field is applied individually to each layer, including a layer as a set of the outer AC winding 4 and the inner AC winding 7, of the superconducting winding 2 composed of three layers. Thus, by the above arrangement, the inductance can be further diminished and the power source can be reduced in size. And, as another example, in FIG. 10 (B), the AC magnetic field is applied individually to each layer of the superconducting winding 2 composed of three layers including the AC winding 8 which is wound with respect to each layer.

Additionally, in each of the above-described embodiments, the power source may be reduced in volume by forming a resonant circuit in which a capacitor and a resistance are connected with the AC winding in series.

(1) Simulation

Figure 11:
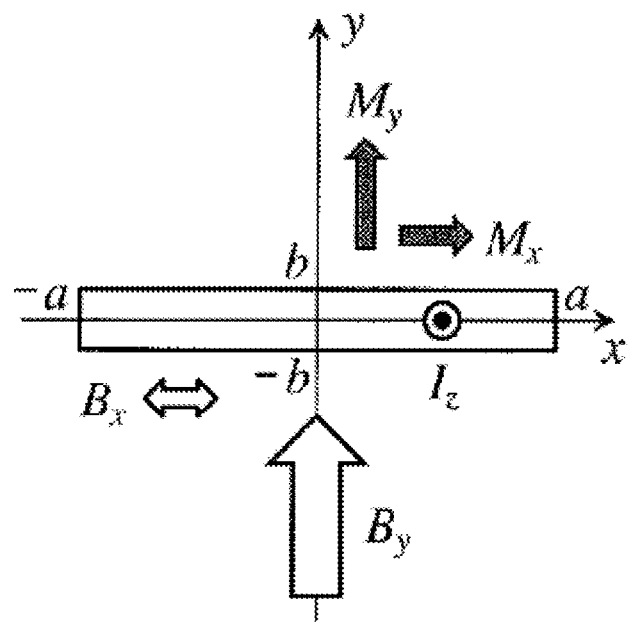
FIG. 11 shows a simulation model of a superconducting magnet according to an example of the present innovation.

The following simulation was conducted on a superconducting magnet according to the present innovation. FIG. 11 shows a numerical analysis model, and Table 1 shows calculation parameters. With the use of the numerical analysis model in FIG. 11, when a transport current $I_z$ is supplied to a tape-shaped superconducting wire whereby an external DC magnetic field $B_y$ and an AC magnetic field $B_x$ are applied thereto, temporal variations of respective magnetizations $M_x$ and $M_y$ are calculated.

TABLE 1

| | |
|---|---|
| Tape width 2a | 10 mm |
| Tape thickness 2b | 0.1 mm |
| Critical current density $J_c$ | 200 A/mm$^2$ |
| Critical current $I_c$ | 200 A |
| Supply current $I_z$ | 100 A |
| DC magnetic field $B_y$ | 1 T |
| AC magnetic field amplitude $B_{xm}$ | 0.1 T |
| Frequency | 1 Hz |

Figure 12:
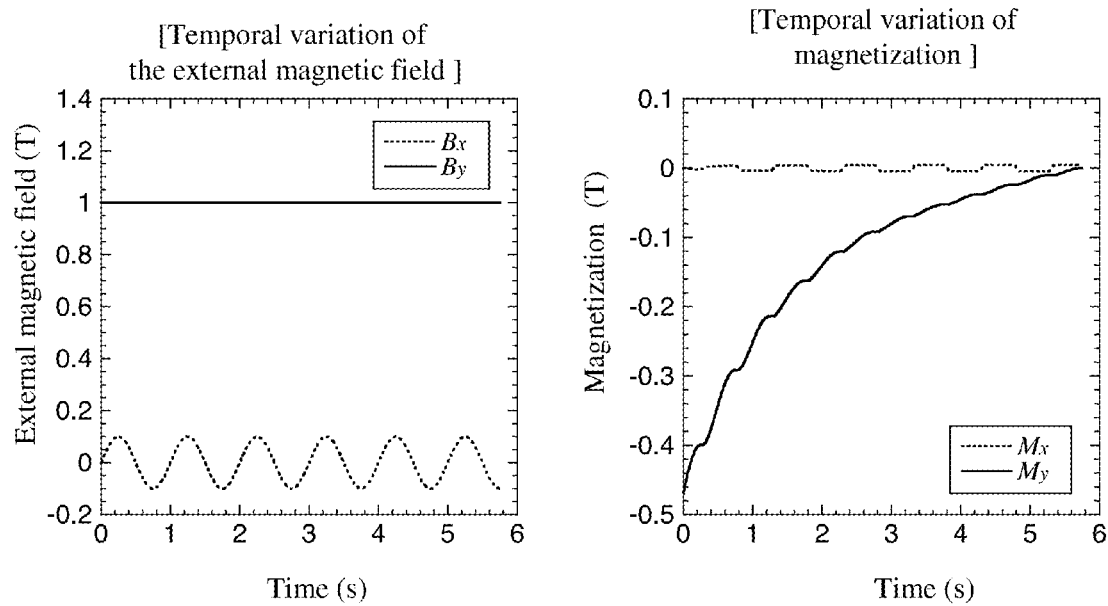
FIG. 12 shows results of the simulation of the superconducting magnet according to the example of the present innovation.

FIG. 12 shows results of the simulation. As shown in FIG. 12, it is recognized that the magnetization $M_y$ exponentially decreases, and the current in the tape-shaped superconducting wire is uniformized. That is, it is indicated that the magnetization $M_y$ in a direction perpendicular to the tape surface is eliminated.

(2) Experiment

Figure 13:
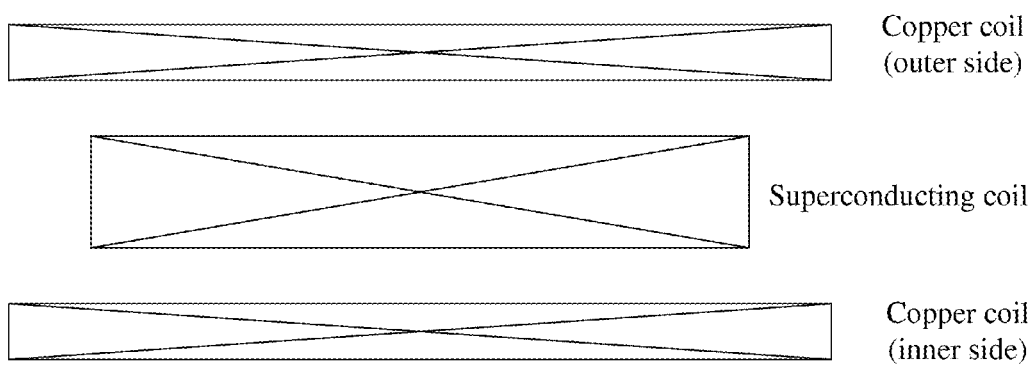
FIG. 13 shows a configuration of experimental coils of a superconducting magnet according to an example of the present innovation.

The following experiments were conducted on a superconducting magnet according to the present innovation. FIG. 13 shows a cross-sectional diagram viewed from one side of the section in the center of the superconducting magnet test-produced for the experiment; the following Table 2 shows specifications of a superconducting coil; and Table 3 shows specifications of a copper coil. The superconducting magnet for the experiment is configured with a superconducting coil composed of $GdBa_2Cu_3O_x$ superconductor, and coils composed of copper wires respectively wound coaxially with the superconducting coil at an inner side and an outer side of the superconducting coil.

TABLE 2

| | |
|---|---|
| Superconductor | $GdBa_2Cu_3O_x$ |
| Tape width | 5 mm |
| Superconducting layer thickness | 1.5 μm |

TABLE 2-continued

| | |
|---|---|
| Critical current | 224 A (77 K) |
| Inner diameter | 63.0 mm |
| Outer diameter | 72.1 mm |
| Average height | 89.5 mm |
| Number of turns | 70.5 turns |

TABLE 3

| | |
|---|---|
| Wire diameter | 1 mm |
| Inner diameter (inside/outside) | 53.0/79.0 mm |
| Outer diameter (inside/outside) | 57.0/82.9 mm |
| Height | 139.8 mm |
| Number of turns | 264 turns |
| Current amplitude | 30 A |
| Frequency | 100 Hz |
| Supply time | 30 s |

Figure 14:
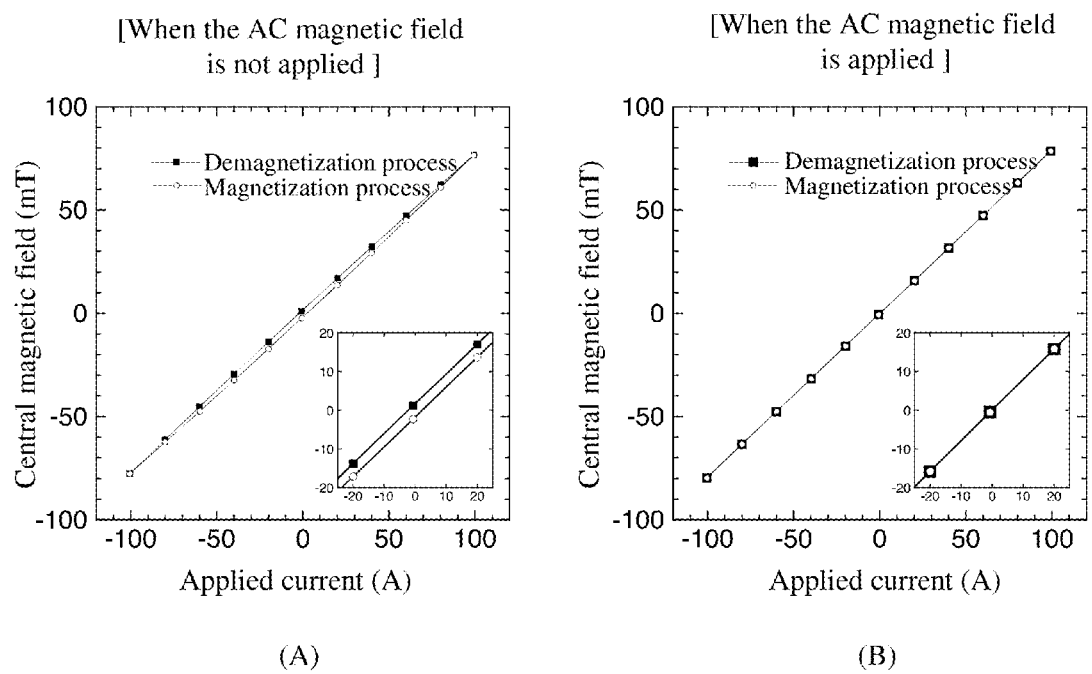
FIG. 14 shows first charts indicating results of an experiment of the superconducting magnet according to an example of the present innovation.
Figure 15:
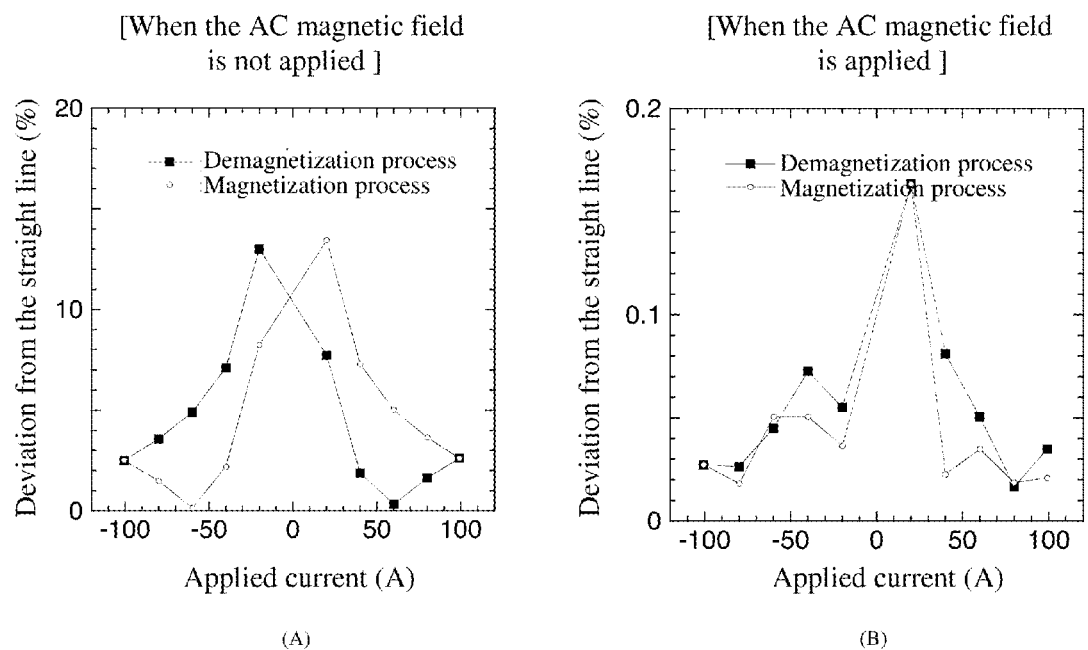
FIG. 15 shows second charts indicating results of an experiment of the superconducting magnet according to an example of the present innovation.
Figure 16:
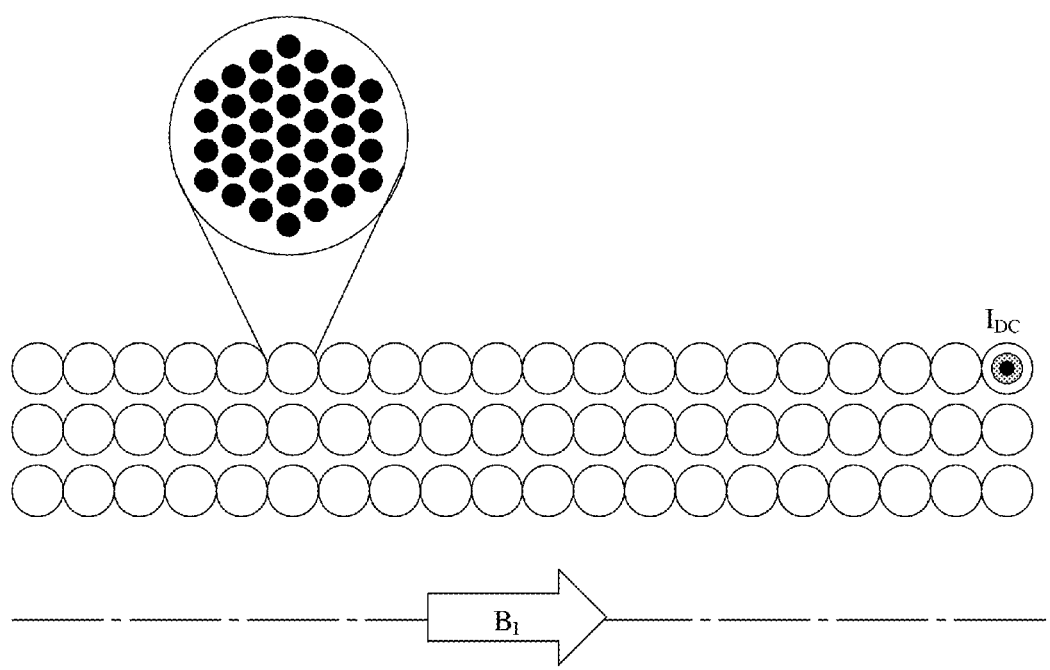
FIG. 16 is a diagram showing a superconducting magnet where a conventional multifilamentary wire is used therefor.

FIG. 14 and FIG. 15 show results of the experiments. FIG. 14 shows each magnitude of the central magnetic field with respect to each current value in a demagnetization process and a magnetization process; and FIG. 15 shows each deviation from the straight line in FIG. 14. FIG. 14 (A) and FIG. 15 (A) are results when the AC magnetic field was not applied; and FIG. 14 (B) and FIG. 15 (B) are results when the AC magnetic field was applied. As is obvious from FIG. 14, hysteresis disappears and the results become into a straight-like line by applying the AC magnetic field. Also, as is obvious from FIG. 15, the deviation from the straight line when the AC magnetic field is applied in FIG. 14 becomes around 0.1% or less, and it is recognized that the deviation is improved close to the measurement limit.

The above experimental results show, in the superconducting magnet according to the present innovation, magnetization in a direction perpendicular to the tape surface of the superconducting tape can be eliminated, and thus the central magnetic field can be maintained uniformly.

DESCRIPTION OF THE NUMERALS

1. Superconducting magnet
2. Superconducting winding
3. Central axis
4. Outer AC winding
5. DC power source unit
6. AC power source unit
7. Inner AC winding
8. AC winding

What is claimed is:

1. A superconducting magnet, comprising:
   a superconducting winding composed of a superconductor of a tape wire through which there is applied a DC current supplied from a DC power source; and
   a magnetic field application unit configured to apply, by applying an AC current supplied from an AC power source, to an AC winding, an AC magnetic field in a direction perpendicular to a direction of magnetization caused in a direction perpendicular to a wider-width surface of the tape wire, by a shielding current in the tape wire of the superconducting winding.

2. The superconducting magnet according to claim 1, wherein
   the magnetic field application unit applies the AC magnetic field; and has an AC winding to which an AC current is supplied so that current flow directions at an outer side of the superconducting winding and at an inner side thereof are opposite to each other.

3. The superconducting magnet according to claim 2, wherein
the magnetic field application unit has an outer AC winding composed of a superconductor or non-superconductor wound coaxially with the superconducting winding, at an outer side of the superconducting winding; and an AC current is supplied to the outer AC winding.

4. The superconducting magnet according to claim 3, wherein
the magnetic field application unit has an inner AC winding composed of a superconductor or non-superconductor wound coaxially with the superconducting winding, at an inner side of the superconducting winding; and a direction of a current to be supplied to the outer AC winding and a direction of a current to be supplied to the inner AC winding are to be in opposite directions to each other.

5. The superconducting magnet according to claim 2, wherein
the magnetic field application unit has an inner AC winding composed of a superconductor or non-superconductor wound coaxially with the superconducting winding, at an inner side of the superconducting winding; and a direction of a current to be supplied to the outer AC winding and a direction of a current to be supplied to the inner AC winding are to be in opposite directions to each other.

6. The superconducting magnet according to claim 1, wherein
the magnetic field application unit has an outer AC winding composed of a superconductor or non-superconductor wound coaxially with the superconducting winding, at an outer side of the superconducting winding; and an AC current is supplied to the outer AC winding.

7. The superconducting magnet according to claim 6, wherein
the magnetic field application unit has an inner AC winding composed of a superconductor or non-superconductor wound coaxially with the superconducting winding, at an inner side of the superconducting winding; and a direction of a current to be supplied to the outer AC winding and a direction of a current to be supplied to the inner AC winding are to be in opposite directions to each other.

8. The superconducting magnet according to claim 1, wherein
the magnetic field application unit has an AC winding composed of a superconductor or non-superconductor wound encircling the superconducting winding in a direction perpendicular to a winding direction of the superconducting winding; and an AC current is supplied to the AC winding.

9. The superconducting magnet according to claim 8, wherein the magnetic field application unit applies the AC magnetic field; and has an AC winding to which an AC current is supplied so that current flow directions at an outer side of the superconducting winding and at an inner side thereof are opposite to each other.

10. The superconducting magnet according to claim 1, wherein
the superconducting winding is a tape-shaped winding composed of a high temperature superconductor.

11. The superconducting magnet according to claim 1, wherein
the magnetic field application unit gradually attenuates an AC magnetic field to be applied.

12. The superconducting magnet according to claim 1, further comprising:
a temperature control unit configured to raise a temperature of the superconducting winding for a predetermined time period.

13. The superconducting magnet according to claim 12, wherein
the temperature control unit is an AC winding; and
the AC winding and the superconducting winding are arranged to be in a closely contact state.

14. The superconducting magnet according to claim 13, wherein
the temperature control unit has a pressure control section configured to control a pressure in a housing where the superconducting magnet is accommodated with a refrigerant.

15. The superconducting magnet according to claim 12, wherein
the temperature control unit has a pressure control section configured to control a pressure in a housing where the superconducting magnet is accommodated with a refrigerant.

16. A nuclear magnetic resonance apparatus using the superconducting magnet according to claim 1, wherein
the magnetic field application unit applies an AC magnetic field for a predetermined time period in advance of measuring an object to be measured; and does not apply the AC magnetic field at the time of measurement.

17. The nuclear magnetic resonance apparatus according to claim 16, wherein
the magnetic field application unit applies the AC magnetic field when a value of a current to be supplied to the superconducting winding is changed.

18. A superconducting magnet, comprising:
a superconducting winding composed of a superconductor;
a magnetic field application unit configured to apply an AC magnetic field in a direction perpendicular to a direction of magnetization caused by a shielding current in the superconducting winding; and
a temperature control unit configured to raise a temperature of the superconducting winding for a predetermined time period, wherein:
the temperature control unit is an AC winding, and
the AC winding and the superconducting winding are arranged to be in a closely contact state.

19. A superconducting magnet, comprising:
a superconducting winding composed of a superconductor;
a magnetic field application unit configured to apply an AC magnetic field in a direction perpendicular to a direction of magnetization caused by a shielding current in the superconducting winding; and
a temperature control unit configured to raise a temperature of the superconducting winding for a predetermined time period, wherein the temperature control unit has a pressure control section configured to control a pressure in a housing where the superconducting magnet is accommodated with a refrigerant.

* * * * *